(12) United States Patent
Lee et al.

(10) Patent No.: US 8,872,797 B2
(45) Date of Patent: Oct. 28, 2014

(54) ORGANIC LIGHT EMITTING DISPLAY DEVICE WITH TOUCH SCREEN FUNCTION

(75) Inventors: Yun-Gyu Lee, Yongin (KR); Andrey Matyushenk, Yongin (KR); Oleg Nkhomiakov, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 937 days.

(21) Appl. No.: 12/823,258

(22) Filed: Jun. 25, 2010

(65) Prior Publication Data

US 2011/0050645 A1    Mar. 3, 2011

(30) Foreign Application Priority Data

Sep. 2, 2009    (KR) .......................... 10-2009-0082564

(51) Int. Cl.
| | |
|---|---|
| *G06F 3/042* | (2006.01) |
| *H01L 33/18* | (2010.01) |
| *G06F 3/041* | (2006.01) |
| *H01L 27/32* | (2006.01) |
| *H01L 51/52* | (2006.01) |

(52) U.S. Cl.
CPC ........... *G06F 3/0412* (2013.01); *H01L 51/5284* (2013.01); *G06F 3/042* (2013.01); *H01L 27/3211* (2013.01); *H01L 27/323* (2013.01); *H01L 27/3244* (2013.01)
USPC .......................................... 345/175; 345/207

(58) Field of Classification Search
CPC .......... G09G 5/00; G06F 3/046; G06F 3/0412
USPC ..................... 345/173–177, 694, 207; 438/24
See application file for complete search history.

(56) References Cited

U.S. PATENT DOCUMENTS

| 7,515,122 B2 * | 4/2009 | Miller et al. ................... 345/76 |
| 2005/0087740 A1 | 4/2005 | Matsumoto et al. |
| 2007/0046650 A1 * | 3/2007 | Lee et al. ..................... 345/173 |
| 2008/0136794 A1 * | 6/2008 | Ishikawa et al. ............. 345/175 |
| 2009/0159786 A1 | 6/2009 | Yang et al. |
| 2009/0225058 A1 * | 9/2009 | Tateuchi et al. .............. 345/175 |

FOREIGN PATENT DOCUMENTS

| JP | 2007-532956 | 11/2007 |
| JP | 2009-169390 | 7/2009 |
| KR | 10-2005-0030165 | 3/2005 |
| KR | 10-2006-0052158 | 5/2006 |
| KR | 10-2009-67075 | 6/2009 |

OTHER PUBLICATIONS

Japanese Office Action dated Nov. 15, 2011 issued by the JPO for corresponding Japanese Patent Application No. 2010-102404, 2 pages, citing JP 2009-169390.
Korean Office Action dated Feb. 22, 2011 issued by the KIPO for corresponding Korean Patent Application No. 10-2009-0082564, 4 pages, citing KR 10-2009-67075.
KIPO Registration Determination Certificate, dated May 19, 2011, for Korean priority Patent application 10-2009-0082564, 5 pages.

* cited by examiner

*Primary Examiner* — Andrew Sasinowski
(74) *Attorney, Agent, or Firm* — Christie, Parker & Hale, LLP

(57) ABSTRACT

An organic light emitting display device with a touch screen function, the apparatus including a first substrate including a pixel region and a nonpixel region, a second substrate disposed above the first substrate so as to be spaced apart from the first substrate, a plurality of pixel units disposed in the pixel region, and a sensor unit disposed in the nonpixel region and detecting light, where each of the plurality of pixel units includes a red subpixel, a green subpixel and a blue subpixel, and the red subpixel is arranged so as not to be adjacent to the sensor unit.

22 Claims, 6 Drawing Sheets

ORGANIC LIGHT EMITTING DISPLAY DEVICE WITH TOUCH SCREEN FUNCTION

CROSS-REFERENCE TO RELATED APPLICATION

This application claims the benefit of Korean Patent Application No. 10-2009-0082564, filed Sep. 2, 2009 in the Korean Intellectual Property Office, the disclosure of which is incorporated herein by reference.

BACKGROUND OF THE INVENTION

1. Field of the Invention

Aspects of the present invention relate to a touch screen display apparatus, and more particularly, to an organic light emitting display device with a touch screen function that easily detects a user's touch.

2. Description of the Related Art

Many display apparatuses are now designed to have a touch panel function. When a touch panel function is incorporated into a display apparatus that primarily has a displaying function, the display apparatus can also be made to function as an input apparatus through touching a surface of a panel of the display apparatus with a finger or pen.

Touch panels can be classified into external type touch panels and internal type touch panels, according to the position of a unit detecting a user's touch. External type touch panels include pressure-type touch panels detecting a change in pressure due to a touch, electric field-type touch panels detecting a change in an electric field due to a touch, and resistance layer-type touch panels detecting a change in resistance due to a touch. Internal type touch panels use auto brightness control (ABC), a P-I-N photo diode (junction), or a photo sensor.

In the case of an internal type touch panel, the touched portion on a screen of the touch panel can be detected using light emitted from an organic light emitting display device operating as a light source in a dark environment. However, when the intensity of the light is weak compared to the sensitivity of the photo sensor, it is not easy to detect the light. In addition, since light emitted from a light source that is not related to a touch may also be incident directly on the photo sensor, touch errors may be generated.

SUMMARY OF THE INVENTION

Aspects of the present invention provide an organic light emitting display device with a touch screen function that has excellent light recognition performance.

An aspect of the present invention provides an organic light emitting display device with a touch screen function, the apparatus including: a first substrate including a pixel region and a nonpixel region; a second substrate disposed above the first substrate so as to be spaced apart from the first substrate; a plurality of pixel units disposed in the pixel region; and at least one sensor unit disposed in the nonpixel region and detecting light, where each of the plurality of pixel units includes a red subpixel, a green subpixel and a blue subpixel, and where the red subpixel is arranged so as not to be adjacent to the sensor unit.

Each sensor unit may include a photo sensor absorbing light having a red wavelength.

Each of the plurality of pixel units may be arranged so that the green subpixel, the blue subpixel and the red subpixel may be disposed from the photo sensor in the order stated.

Each of the plurality of pixel units may be arranged so that the blue subpixel, the green subpixel and the red subpixel may be disposed from the photo sensor in the order stated.

When a pair of pixel units may be adjacent to each other, the red subpixels of the pair of pixel units may also be adjacent to each other.

The apparatus may further include a light absorbing pattern unit disposed on a surface of the second substrate and facing the plurality of pixel units, so as to correspond to an interval between each sensor unit and the adjacent pixel units.

Light emitted from the plurality of pixel units may be absorbed by the light absorbing pattern unit, and may be reflected by the second substrate so as to prevent the light being incident on the sensor unit.

The light absorbing pattern unit may have a black color so as to absorb the light.

The apparatus may further include a transparent layer disposed on a surface of the second substrate and facing the plurality of pixel units, where the transparent layer may include grooves formed so as to correspond to each sensor unit, and where a reflective layer may be disposed on an inner side surface of the groove.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
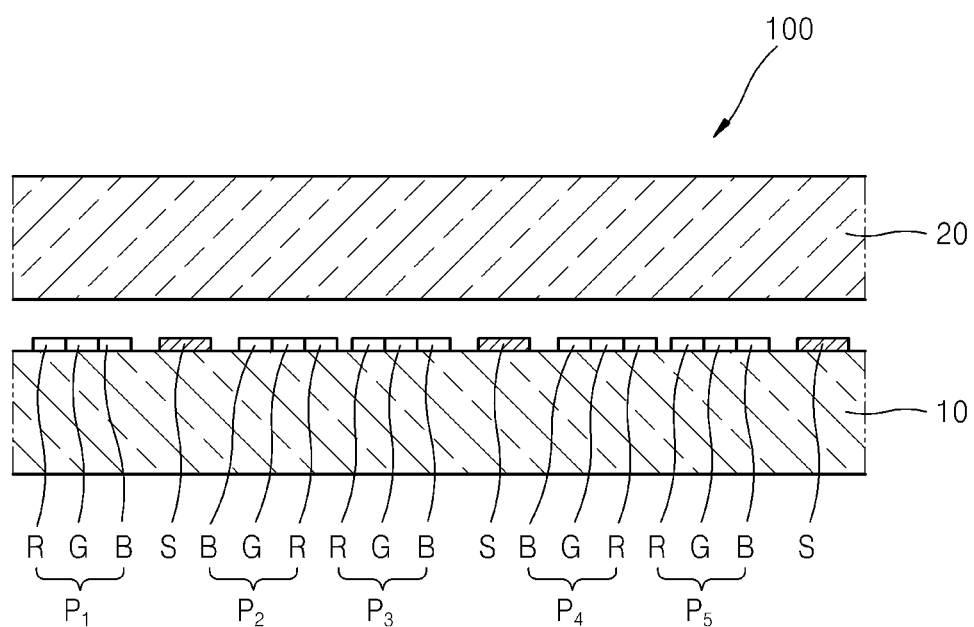
FIG. 1 is a cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
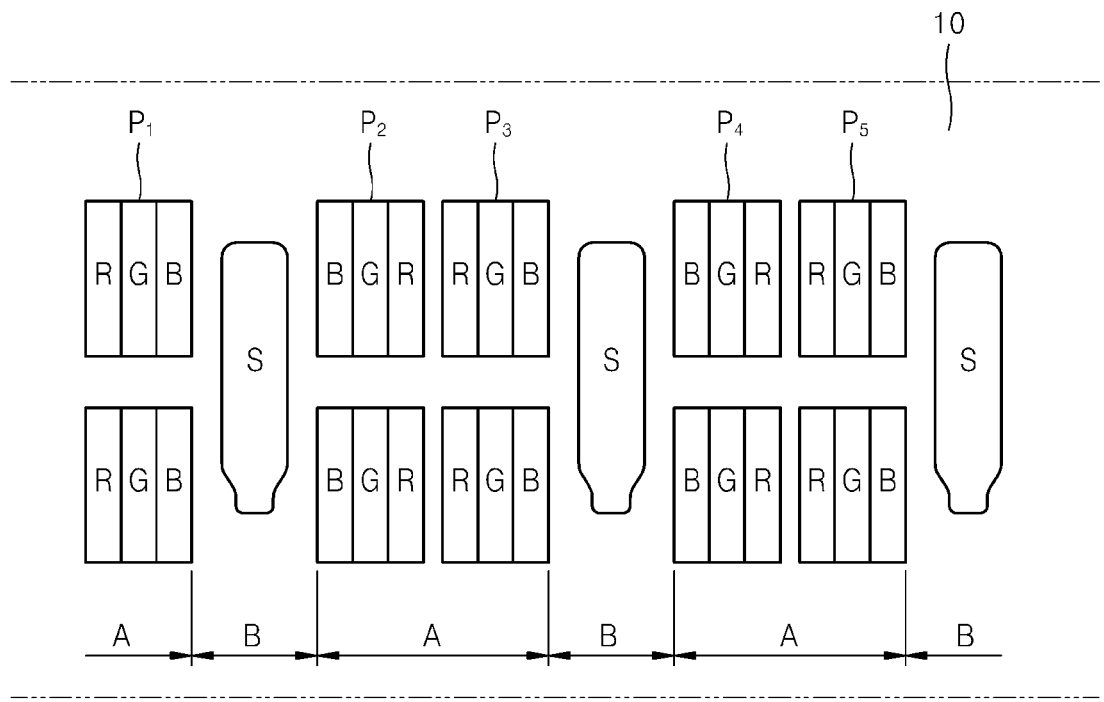
FIG. 2 is a plan view of the organic light emitting display device of FIG. 1.

FIG. 1 is a cross-sectional view of an organic light emitting display device 100 according to an embodiment of the present invention and FIG. 2 is a plan view of the embodiment of FIG. 1. In detail, FIG. 1 illustrates an arrangement of a plurality of pixel units $P_1$, $P_2$, $P_3$, $P_4$ and $P_5$, and a plurality of sensor units S, which are disposed on a first substrate 10.

Referring to FIGS. 1 and 2, the first substrate 10 may include pixel regions A and nonpixel regions B. The pixel units $P_1$, $P_2$, $P_3$, $P_4$ and $P_5$ may be disposed in the pixel regions A, and the sensor units S are disposed in the nonpixel regions B.

Each of the pixel units $P_1$, $P_2$, $P_3$, $P_4$ and $P_5$ may include three subpixels R, G and B. The three subpixels R, G and B may consist of a red subpixel R, a green subpixel G and a blue subpixel, respectively.

Each sensor unit S may each include a photo sensor detecting light reflected from a touched position of a second substrate 20. Generally, since the second substrate 20 is touched by fingers, each sensor unit S may include a photo sensor absorbing light having a red wavelength.

Sensor units S may be disposed between the pixel units $P_1$, $P_2$, $P_3$, $P_4$ and $P_5$. In detail, as illustrated in FIG. 1, the sensor units S may be respectively disposed between the pixel unit $P_1$ and the pixel unit $P_2$, and between the pixel unit $P_3$ and the pixel unit $P_4$.

The subpixels R, G and B may be disposed in the pixel units $P_1$, $P_2$, $P_3$, $P_4$ and $P_5$ so that the red subpixel R is not adjacent to the sensor units S. That is, the subpixels R, G and B may be disposed in the pixel units $P_1$, $P_2$, $P_3$, $P_4$ and $P_5$ so that the blue subpixel B, the green subpixel G and the red subpixel R may be sequentially arranged in that order stated from the sensor units S. By arranging the red subpixel R as far away from the sensor units S as possible, the influence of red light emitted from the red subpixels R on the sensor units S may be minimized. In detail, since the sensor units S may each use a photo sensor sensitive to red light, the sensor units S may detect the red light. In this regard, if the sensor units S are adjacent to the red subpixels R, red light emitted from the red subpixels R is incident directly on the sensor units S. Thus, without touching the second substrate 20, the sensor units S may interpret the red light as indicating that the second substrate 20 has been touched, thereby generating touch errors. However, according to the present embodiment, since the red subpixels R are arranged as far away from the sensor units S as possible, the influence of the red subpixels R on the sensor units S may be minimized, thereby preventing such touch errors.

Red subpixels R of the pixel units $P_2$ and $P_3$, or $P_4$ and $P_5$ that are adjacent to each other may be arranged so that the red subpixels R may be adjacent to each other. That is, in FIGS. 1 and 2, the subpixels R, G and B are arranged in the pixel units $P_2$ and $P_3$, or $P_4$ and $P_5$ that are adjacent to each other so that the red subpixel R of the pixel unit $P_2$ may be adjacent to the red subpixel R of the pixel unit $P_3$, and the red subpixel R of the pixel unit $P_4$ may be adjacent to the red subpixel R of the pixel unit $P_5$. Thus, the subpixels R, G and B are arranged in the pixel unit $P_2$ so that the blue subpixel B, the green subpixel G, and the red subpixel R may be arranged from the sensor units S in the order stated. In addition, the subpixels R, G and B may be arranged in the pixel unit $P_3$ adjacent to the pixel unit $P_2$ so that the red subpixel R, the green subpixel G and the blue subpixel B may be arranged from the pixel unit $P_2$ in the order stated. By arranging the red subpixels R as far away from the sensor units S as possible, and arranging the red subpixels R to be adjacent to each other, the direct influence of red light emitted from the red subpixels R on the sensor units S may be minimized. In addition, the intensity of light emitted from the red subpixels R that are adjacent to each other increases, thereby improving the performance of the sensor units S for recognizing red light reflected from a touched position on the second substrate 20.

Figure 3:
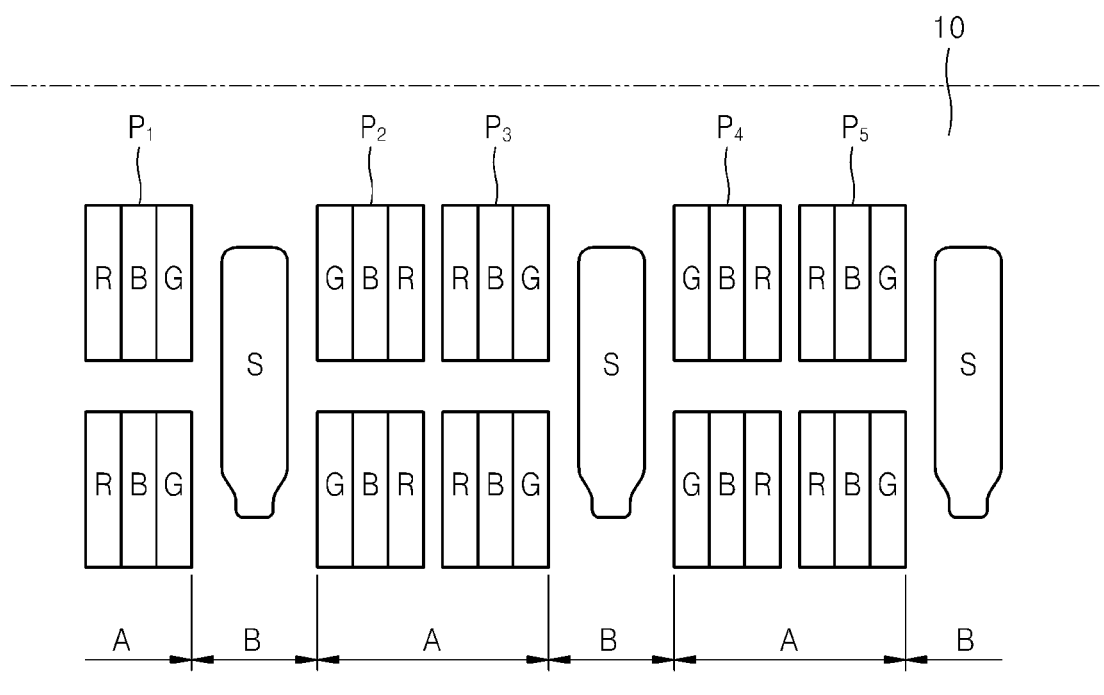
FIG. 3 is a plan view of an organic light emitting display device according to another embodiment of the present invention.

FIG. 3 is a plan view of an organic light emitting display device according to another embodiment of the present invention. The organic light emitting display device of FIG. 3 is a modified example of the organic light emitting display device of FIGS. 1 and 2. Referring to FIG. 3, the subpixels R, G and B may be arranged in the pixel units $P_1$, $P_2$, $P_3$, $P_4$ and $P_5$ so that the red subpixels R may be arranged so as not to be adjacent to the sensor units S. That is, the subpixels R, G and B may be arranged in the pixel units $P_1$, $P_2$, $P_3$, $P_4$ and $P_5$ so that the green subpixel G, the blue subpixel B and the red subpixel R may be arranged from the sensor units S in the order stated.

The red subpixels R of the pixel units $P_2$ and $P_3$, or $P_4$ and $P_5$ that are adjacent to each other may be arranged so that the red subpixels may be adjacent to each other. That is, in FIG. 3, the subpixels R, G and B are arranged in the pixel units $P_2$ and $P_3$, or $P_4$ and $P_5$ that are adjacent to each other so that the red subpixel R of the pixel unit $P_2$ may be adjacent to the red subpixel R of the pixel unit $P_3$, and the red subpixel R of the pixel unit $P_4$ may be adjacent to the red subpixel R of the pixel unit $P_5$. Thus, the subpixels R, G and B are arranged in the pixel unit $P_2$ so that the green subpixel G, the blue subpixel B, and the red subpixel R may be arranged from the sensor unit S in the order stated. In addition, the subpixels R, G and B are arranged in the pixel unit $P_3$ adjacent to the pixel unit $P_2$ so that the red subpixel R, the blue subpixel B and the green subpixel G, may be arranged from the pixel unit $P_2$ in the order stated.

Figure 4:
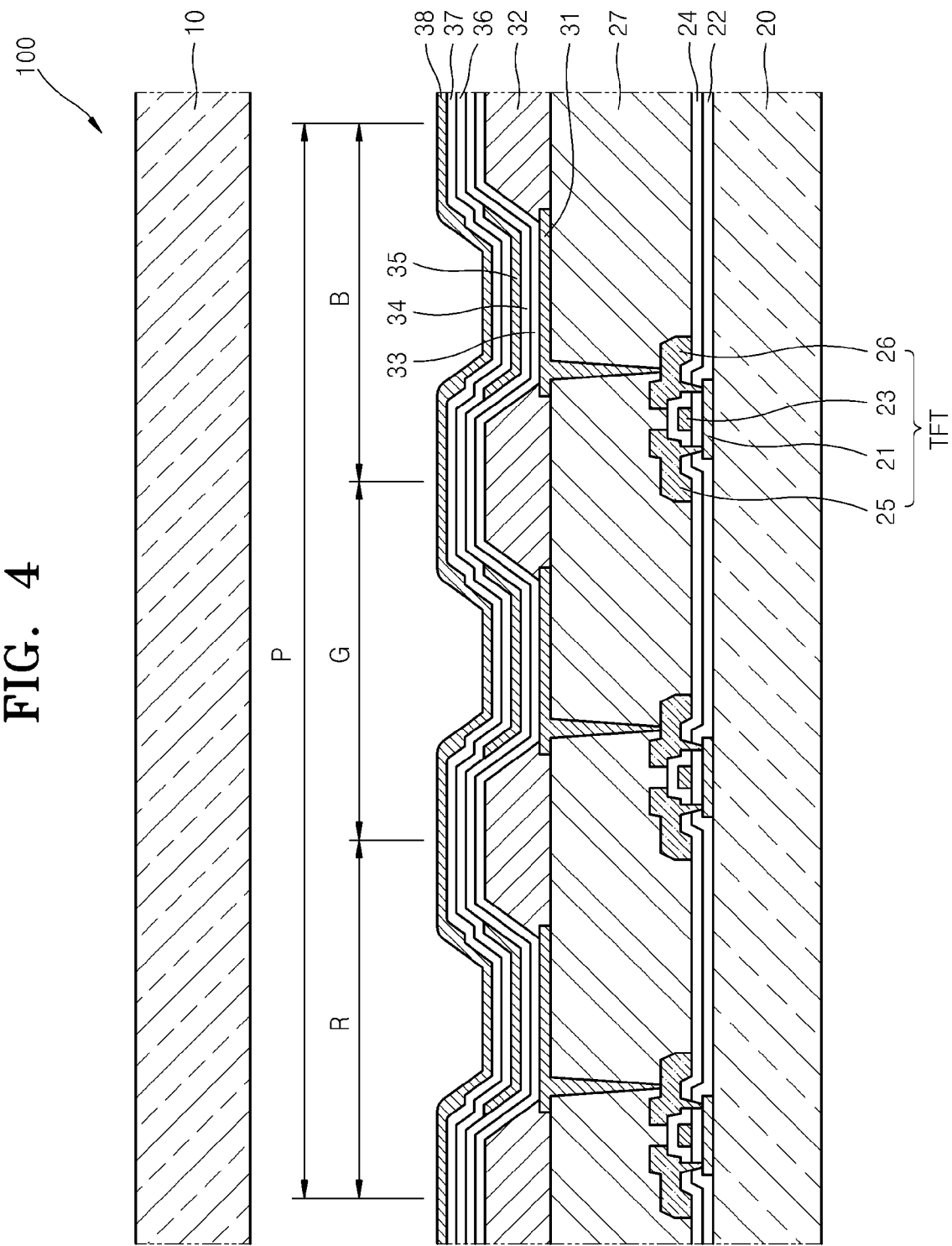
FIG. 4 is a cross-sectional view of a pixel unit of FIG. 1.

FIG. 4 is a cross-sectional view of a pixel unit P constituting one of the pixel units $P_1$, $P_2$, $P_3$, $P_4$ and $P_5$ of FIG. 1, according to an embodiment of the present invention. That is, FIG. 4 illustrates an active matrix organic light emitting display device (AMOLED) in which the subpixels R, G and B are arranged on the first substrate 10. At least one of the subpixels R, G and B includes a thin film transistor (TFT). However, the TFT is not particularly limited. That is, the number of TFTs used may vary and various types of TFT may be used. The AMOLED will now be described in more detail.

The first substrate 10 may be an insulating substrate formed of a transparent glass including $SiO_2$ as the primary compound, a plastic substrate, or a quartz substrate. Although not illustrated in FIG. 4, a buffer layer (not shown) formed of $SiO_2$ and/or $SiN_x$ may be used in order to planarize the first substrate 10 and prevent the penetration of impurities.

A TFT is disposed on the first substrate 10. The TFT includes a semiconductor active layer 21, a gate insulating layer 22 covering the semiconductor active layer 21, and a gate electrode 23 formed on the gate insulating layer 22. An interlayer insulating film 24 is formed so as to cover the gate electrode 23, and source and drain electrodes 25 and 26 are formed on the interlayer insulating film 24. The source and drain electrodes 25 and 26 are in contact with source and drain regions, respectively, via contact holes formed in the gate insulating layer 22 and the interlayer insulating film 24.

A first electrode 31 of the pixel unit P formed on a planarization layer 27 is connected to the source and drain electrodes 25 and 26 via a via hole. A pixel defining layer 32 is formed so as to cover the first electrode 31. An opening is formed in the pixel defining layer 32, intermediate layers 33, 34, 36 and 37 including an organic light emitting layer 35 are formed, and then a second electrode 38 is formed as a common electrode on the intermediate layers 33, 34, 36 and 37.

The first electrode 31 may be used as an anode, and the second electrode 38 may be used as a cathode, or vice versa. The first electrode 31 may be a reflective electrode. In this regard, the first electrode 31 may be a reflective layer formed of Ag, Mg, Al, Pt, Pd, Au, Ni, Nd, Ir, Cr, or mixtures thereof, and then ITO, IZO, ZnO, or $In_2O_3$ may be formed on the reflective layer.

The second electrode 38 may be a transparent electrode. If the second electrode 38 is used as a cathode, a metal (or metal alloy or compound) with a low work function, such as Li, Ca, LiF/Ca, LiF/Al, Al, Ag, Mg, or mixtures thereof is deposited toward the organic light emitting layer 35, and then an auxiliary electrode layer or bus electrode line formed of a metal for forming a transparent electrode, such as ITO, IZO, ZnO, or $In_2O_3$, may be formed on the metal.

Each of the intermediate layers 33, 34, 36 and 37 and the organic light emitting layer 35 may be a small-molecular weight organic layer or a polymer organic layer. More specifically, if the intermediate layers 33, 34, 36 and 37 are small small-molecular weight organic layers, the intermediate layers 33, 34, 36 and 37 may include a hole injection layer (HIL) 33, a hole transport layer (HTL) 34, an emissive layer (EML) 35, an electron transport layer (ETL) 36, and an electron injection layer (EIL) 37 stacked in a single or composite stack structure, and may be formed of various organic materials including copper phthalocyanine (CuPc), N,N'-Di(naphthalene-1-yl)-N,N'-diphenyl-benzidine ($\alpha$-NPB) or tris-8-hydroxyquinoline aluminum (Alq3). The small-molecular weight organic layer may be formed using a vacuum deposition method.

In FIG. 4, the intermediate layers 33, 34, 36 and 37 are illustrated as being small-molecular weight organic layers, but the present invention is not limited thereto. That is, if each of the intermediate layers 33, 34, 36 and 37 is a polymer organic layer, the polymer organic layer may be formed of a structure including an HTL and an EML. The HTL may be formed of poly(3,4-ethylenedioxythiophene) (PEDOT), and the EML may be formed of a poly-phenylenevinylene (PPV)-based or polyfluorene-based polymer organic material. The HTL and the EML may be formed using a screen printing method, inkjet printing method, or a laser induced thermal imaging (LITI) method.

In FIG. 4, the thickness of the organic light emitting layer 35 is uniform, but the present invention is not limited thereto. That is, portions of the organic light emitting layer 35 corresponding to the subpixels R, G and B may have different thicknesses so as to be suitable for a resonance structure, or may each include an auxiliary light emissive layer.

Figure 5:
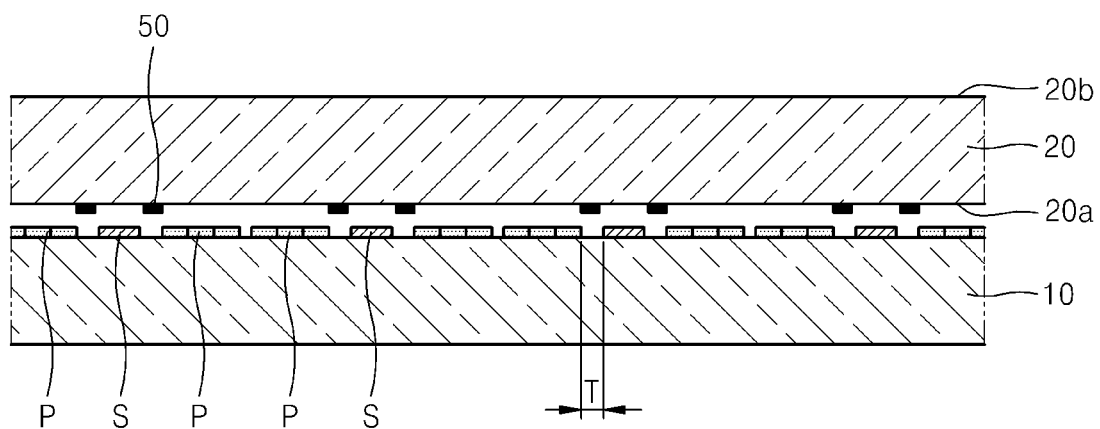
FIG. 5 is a cross-sectional view of an organic light emitting display device according to another embodiment of the present invention.
Figure 6:
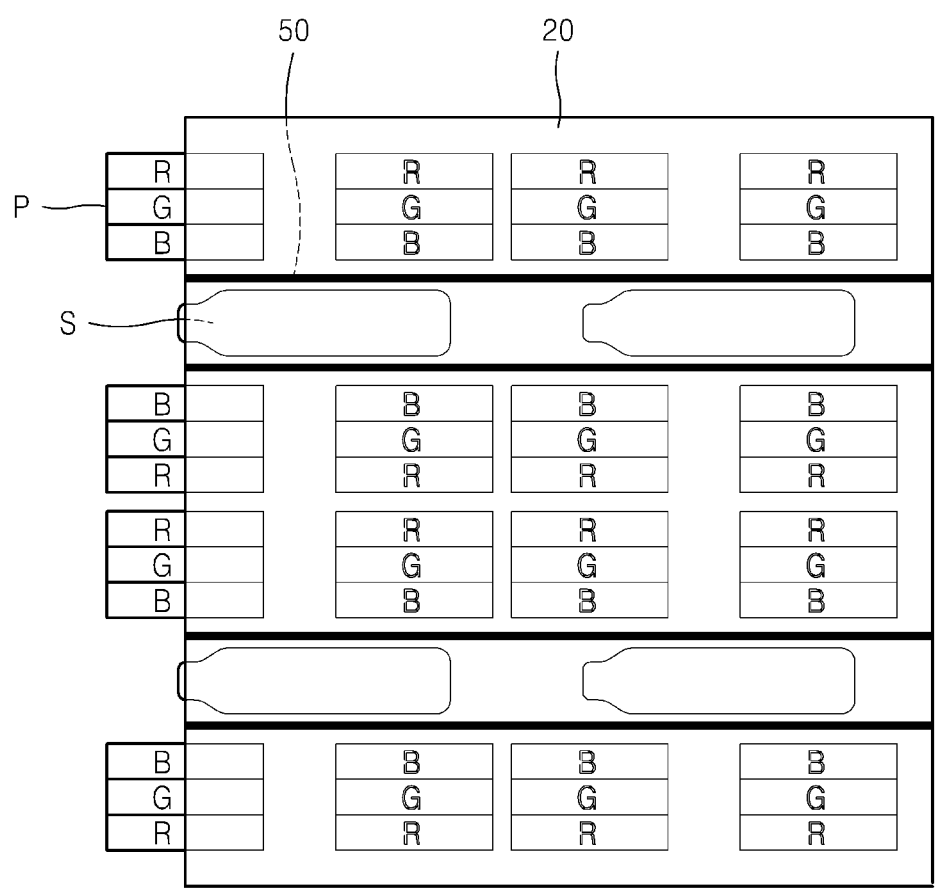
FIG. 6 is a plan view of the organic light emitting display device of FIG. 5.

FIG. 5 is a cross-sectional view of an organic light emitting display device according to another embodiment of the present invention. FIG. 6 is a plan view of the organic light emitting display device of FIG. 5.

Referring to FIGS. 5 and 6, the organic light emitting display device according to the present embodiment includes a second substrate 20 that may be disposed above a first substrate 10 so as to be spaced apart from the first substrate 10. A light absorbing pattern unit 50 may be disposed on a surface of the second substrate 20, which faces the first substrate 10. The light absorbing pattern unit 50 may be disposed on the surface of the second substrate 20 so as to correspond to an interval T between each sensor unit S and a pixel unit P disposed on the first substrate 10. The light absorbing pattern unit 50 may absorb light emitted from the pixel unit P and reflects the light on a lower surface 20a of the second substrate 20, thereby preventing the light being incident directly on the sensor unit S. Each sensor unit S may absorb light that is emitted from the pixel unit P and then is reflected by a finger touched on an upper surface 20b of the second substrate 20, and thus may detect a touched position on the second substrate 20. When the light emitted from the pixel unit P is reflected by the lower surface 20a of the second substrate 20 and then is incident on the sensor unit S, touch errors may be generated. According to the present embodiment, by disposing the light absorbing pattern unit 50 on the lower surface 20a of the second substrate 20, light emitted from the pixel unit P may be absorbed by the light absorbing pattern unit 50, and thus may be prevented from being reflected by the lower surface 20a of the second substrate 20 and then being incident on the sensor unit S, thereby increasing the accuracy of a touch. The light absorbing pattern unit 50 may be formed of a material absorbing light, in particular, a black material.

Figure 7:
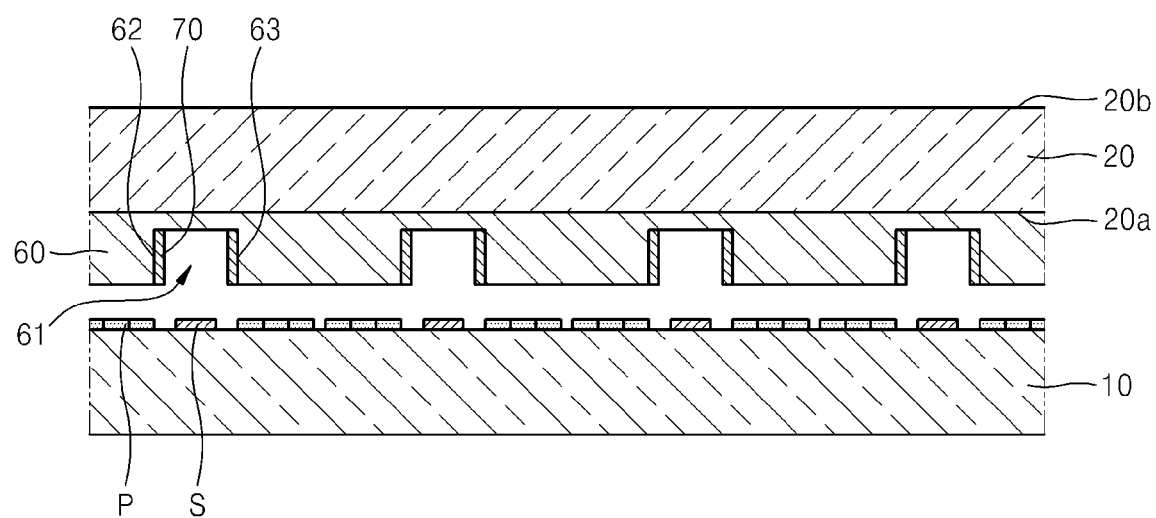
FIG. 7 is a cross-sectional view of an organic light emitting display device according to another embodiment of the present invention.

FIG. 7 is a cross-sectional view of an organic light emitting display device according to another embodiment of the present invention. Referring to FIG. 7, the organic light emitting display device according to the present embodiment includes a second substrate 20 disposed above a first substrate 10 so as to be spaced apart from the first substrate 10. A transparent layer 60 may be disposed on a lower surface of the second substrate 20, that is, the transparent layer 60 may face the first substrate 10. The transparent layer 60 may include grooves 61 formed so as to correspond to a plurality of sensor units S formed on the upper surface of the first substrate 10. Also, a plurality of pixel units P may be disposed on the upper surface of the first substrate 10 between the sensor units S. The grooves 61 may be opened toward the first substrate 10. Reflective layers 70 may be disposed on both inner side surfaces 62 and 63 of the grooves 61. When light emitted from the pixel units P may be directed towards the reflective layers 70, the reflective layers 70 may reflect the light, and thus the light may be prevented from being incident directly on the sensor units S, thereby increasing the accuracy of a touch.

Therefore, according to aspects of the present invention, an organic light emitting display device with a touch screen can be provided that has excellent touch recognition reliability.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display apparatus with a touch screen function, the apparatus comprising:
    a first substrate comprising at least one pixel region and at least one nonpixel region;
    a second substrate above the first substrate so as to be spaced apart from the first substrate;
    a plurality of pixel units in one or more of the at least one pixel region; and
    a plurality of sensor units in one or more of the at least one nonpixel region and configured to detect light,
    wherein:
        at least two of the pixel units are between adjacent ones of the sensor units;
        each of the plurality of pixel units comprises a red subpixel, a green subpixel and a blue subpixel; and
        each red subpixel is separated from each of the sensor units by at least one other subpixel and is adjacent the red subpixel in an adjacent one of the pixel units.

2. The apparatus of claim 1, wherein each of the sensor units further comprises a photo sensor configured to sense light having a red wavelength.

3. The apparatus of claim 2, wherein each of the plurality of pixel units are arranged so that the green subpixel, the blue subpixel and the red subpixel are disposed from an adjacent one of the sensor units in the order stated.

4. The apparatus of claim 2, wherein each of the plurality of pixel units are arranged so that the blue subpixel, the green subpixel and the red subpixel are disposed from an adjacent one of the sensor units in the order stated.

5. The apparatus of claim 2, wherein the red subpixels of adjacent ones of the pixel units are adjacent each other.

6. The apparatus of claim 1, further comprising a light absorbing pattern unit on a surface of the second substrate, facing the plurality of pixel units, and corresponding to an interval between one of the sensor units and one of the pixel units adjacent thereto.

7. The apparatus of claim 6, wherein light emitted from the plurality of pixel units is absorbed by the light absorbing pattern unit, and is reflected by the second substrate so as to prevent the light being incident on the sensor units.

8. The apparatus of claim 7, wherein the light absorbing pattern unit has a black color so as to absorb the light.

9. An organic light emitting display apparatus with a touch screen function, the apparatus comprising:
a first substrate comprising at least one pixel region and at least one nonpixel region;
a second substrate above the first substrate and spaced from the first substrate;
a plurality of pixel units in one or more of the at least one pixel region;
a plurality of sensor units in one or more of the at least one nonpixel region and configured to detect light; and
a transparent layer on a surface of the second substrate and facing the plurality of pixel units,
wherein:
at least two of the pixel units are between adjacent ones of the sensor units,
each of the plurality of pixel units comprises a red subpixel, a green subpixel, and a blue subpixel,
each red subpixel is separated from the sensor units by at least one other subpixel,
the transparent layer comprises grooves formed so as to correspond to each sensor unit, and
a reflective layer is disposed on an inner side surface of the groove.

10. A method of manufacture of an organic light emitting display device with touch screen function comprising a plurality of pixel units on a first substrate, a plurality of sensor units on the first substrate, a second substrate above the first substrate and spaced apart from the first substrate, and a red subpixel, a green subpixel, and a blue subpixel in each of the pixel units, the method comprising:
arranging the pixel units such that at least two of the pixel units are between adjacent ones of the sensor units;
arranging the subpixels of one of the pixel units to have at least one of the green subpixel or the blue subpixel between the red subpixel and an adjacent one of the sensor units;
arranging a light absorbing pattern unit on a surface of the second substrate facing the plurality of pixel units so as to correspond to intervals between each of the sensor units and ones of the pixel units adjacent thereto; and
arranging adjacent ones of the pixel units such that a color order of the subpixels alternates between the adjacent pixel units.

11. The method of claim 10, wherein each of the sensor units comprises a photo sensor configured to sense light having a red wavelength.

12. The method of claim 10, wherein each of the plurality of pixel units is arranged so that the green subpixel, the blue subpixel and the red subpixel are disposed from the adjacent one of the sensor units in the order stated.

13. The method of claim 10, wherein each of the plurality of pixel units is arranged so that the blue subpixel, the green subpixel and the red subpixel are disposed from the adjacent one of the sensor units in the order stated.

14. The method of claim 10, wherein adjacent ones of the pixel units are arranged so that the red subpixels thereof are adjacent each other.

15. The method of claim 10, wherein the light absorbing pattern unit has a black color so as to absorb the light.

16. A method of manufacture of an organic light emitting display device with touch screen function comprising a plurality of pixel units on a first substrate, a plurality of sensor units on the first substrate, a second substrate above the first substrate and spaced from the first substrate, and a red subpixel, a green subpixel, and a blue subpixel in each of the pixel units, the method comprising:
arranging the pixel units such that at least two of the pixel units are between adjacent ones of the sensor units;
arranging the subpixels of one of the pixel units to have at least one of the green subpixel or the blue subpixel between the red subpixel and an adjacent one of the sensor units;
arranging a light absorbing pattern unit on a surface of the second substrate facing the plurality of pixel units so as to correspond to intervals between each of the sensor units and ones of the pixel units adjacent thereto; and
forming a transparent layer on a surface of the second substrate facing the plurality of pixel units,
wherein:
the transparent layer defines grooves corresponding to each of the sensor units; and
a reflective layer is at an inner side surface of each groove.

17. A method of improving touch recognition reliability of an organic light emitting display device with a touch screen function comprising a plurality of pixel units on a first substrate, a plurality of sensor units on the first substrate, adjacent ones of the sensor units being separated by at least two of the pixel units, a plurality of photo sensors configured to sense light in a red wavelength and incorporated into respective ones of the sensor units, a second substrate above the first substrate and spaced apart from the first substrate, a red, green and blue subpixel in each of the pixel units and arranged such that an order of the red, green, and blue subpixels alternates between adjacent ones of the pixel units with at least one of the green subpixel or the blue subpixel between the red subpixel and an adjacent one of the sensor units, and a light absorbing pattern unit on a surface of the second substrate and facing the plurality of pixel units so as to correspond to an interval between one of the sensor units and an adjacent one of the pixel units, the method comprising:
touching an outer surface of the second substrate with a finger; and
causing light to be absorbed by the light absorbing pattern unit.

18. The method of claim 17, wherein each of the plurality of pixel units is arranged so that the green subpixel, the blue subpixel and the red subpixel are disposed from the photo sensor in the order stated.

19. The method of claim 17, wherein each of the plurality of pixel units is arranged so that the blue subpixel, the green subpixel and the red subpixel are disposed from the photo sensor in the order stated.

20. The method of claim 17, wherein red subpixels of adjacent ones of the pixel units are adjacent each other.

21. The method of claim 17, wherein the light absorbing pattern unit has a black color so as to absorb the light.

22. A method of improving touch recognition reliability of an organic light emitting display device with a touch screen function comprising a plurality of pixel units on a first substrate, a plurality of sensor units on the first substrate, adjacent ones of the sensor units being separated by at least two of the pixel units, a plurality of photo sensors configured to sense light in a red wavelength and incorporated into respective ones of the sensor units, a second substrate above the first substrate and spaced apart from the first substrate, a red subpixel, a green subpixel, and a blue subpixel in each of the pixel units, a light absorbing pattern unit on a surface of the second substrate facing the plurality of pixel units so as to correspond to an interval between one of the sensor units and an adjacent one of the pixel units, and a transparent layer on the surface of the second substrate facing the plurality of pixel units, the transparent layer defining grooves corresponding to each of the sensor units, each groove having a reflective layer at an inner side surface thereof, the method comprising:

touching an outer surface of the second substrate with a finger; and causing light to be absorbed by the light absorbing pattern unit.

* * * * *